(12) United States Patent
Kobayashi et al.

(10) Patent No.: US 12,347,675 B2
(45) Date of Patent: Jul. 1, 2025

(54) METHODS AND SYSTEMS FOR TOPOGRAPHY-SELECTIVE DEPOSITIONS

(71) Applicant: ASM IP Holding B.V., Almere (NL)

(72) Inventors: Akiko Kobayashi, Inagi (JP); René Henricus Jozef Vervuurt, Leuven (BE); Nobuyoshi Kobayashi, Kawagoe (JP); Takayoshi Tsutsumi, Nagoya (JP); Masaru Hori, Nissin (JP)

(73) Assignee: ASM IP Holding B.V., Almere (NL)

( * ) Notice: Subject to any disclaimer, the term of this patent is extended or adjusted under 35 U.S.C. 154(b) by 438 days.

(21) Appl. No.: 17/747,197

(22) Filed: May 18, 2022

(65) Prior Publication Data

US 2022/0375744 A1 Nov. 24, 2022

Related U.S. Application Data

(60) Provisional application No. 63/191,693, filed on May 21, 2021.

(51) Int. Cl.

| | | |
|---|---|---|
| *H01L 21/02* | (2006.01) | |
| *C23C 16/40* | (2006.01) | |
| *C23C 16/455* | (2006.01) | |
| *C23C 16/458* | (2006.01) | |
| *H01J 37/32* | (2006.01) | |

(52) U.S. Cl.
CPC ........ *H01L 21/0228* (2013.01); *C23C 16/402* (2013.01); *C23C 16/4554* (2013.01); *C23C 16/45553* (2013.01); *C23C 16/4583* (2013.01); *H01L 21/02164* (2013.01); *H01L 21/02211* (2013.01); *H01J 37/32082* (2013.01); *H01J 37/3244* (2013.01); *H01J 37/32816* (2013.01); *H01J 2237/2001* (2013.01)

(58) Field of Classification Search
CPC .................................................. H01L 21/0228
See application file for complete search history.

(56) References Cited

U.S. PATENT DOCUMENTS

2012/0295420 A1* 11/2012 Pal ...................... H10D 84/0172
                                                                    438/585
2019/0196340 A1*  6/2019 De Silva ............ H01L 21/0332
2019/0355668 A1* 11/2019 Rizzolo .................. H10B 61/00

OTHER PUBLICATIONS

Kim, W.H. et al. "A Process for Topographically Selective Deposition on 3D Nanostructures by Ion Implantation" ACS Nano 2016, 10 (4), 4451-4458.
Dingemans, G., et al. "Plasma-Assisted ALD for the Conformal Deposition of SiO2: Process, Material and Electronic Properties"; Journal of the Electrochemical Society 159 (3) (2012): H277-H285.

* cited by examiner

*Primary Examiner* — William A Harriston
(74) *Attorney, Agent, or Firm* — Snell & Wilmer L.L.P.

(57) ABSTRACT

Methods and related systems for topographically depositing a material on a substrate are disclosed. The substrate comprises a proximal surface and a gap feature. The gap feature comprises a sidewall and a distal surface. Exemplary methods comprise, in the given order: a step of positioning the substrate on a substrate support in a reaction chamber; a step of subjecting the substrate to a plasma pre-treatment; and, a step of selectively depositing a material on at least one of the proximal surface and the distal surface with respect to the sidewall. The step of subjecting the substrate to a plasma pre-treatment comprises exposing the substrate to at least one of fluorine-containing molecules, ions, and radicals.

20 Claims, 8 Drawing Sheets

METHODS AND SYSTEMS FOR TOPOGRAPHY-SELECTIVE DEPOSITIONS

CROSS-REFERENCE TO RELATED APPLICATIONS

This application claims priority to U.S. Provisional Patent Application Ser. No. 63/191,693 filed May 21, 2021 titled METHODS AND SYSTEMS FOR TOPOGRAPHY-SELECTIVE DEPOSITIONS, the disclosure of which is hereby incorporated by reference in its entirety.

FIELD OF INVENTION

The present disclosure generally relates to methods and systems suitable for forming electronic devices. More particularly, the disclosure relates to methods and systems that can be used for selectively depositing a material on particular parts of a substrate comprising a plurality of gaps.

BACKGROUND OF THE DISCLOSURE

The scaling of semiconductor devices has led to significant improvements in speed and density of integrated circuits. However, with miniaturization of wiring pitch of large-scale integration devices, patterning steps become more expensive. Therefore, there is a need for processes that allow depositing a material on selected parts of a substrate, and not on others. Such process can be useful, for example, in the context of logic and/or memory devices. In particular, topographically selective depositions are desirable for many applications. Topographically selective depositions can feature selective deposition on one or more, but not all, of a top, bottom, and sidewall of a structure.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to topography-selective depositions, to structures and devices formed using such methods, and to apparatus for performing the methods and/or for forming the structure and/or devices. The ways in which various embodiments of the present disclosure address drawbacks of prior methods and systems are discussed in more detail below.

Described herein is a method for topography-selective deposition of a material on a substrate. The substrate comprises a proximal surface and a gap feature. The gap feature comprises a sidewall and a distal surface. The method comprises, in the following order: a step of positioning the substrate on a substrate support in a reaction chamber; a step of subjecting the substrate to a plasma pre-treatment; and a step of selectively depositing a material on at least one of the proximal surface and the distal surface with respect to the sidewall. The step of subjecting the substrate to a plasma pre-treatment comprises exposing the substrate to at least one of fluorine-containing molecules, ions, and radicals.

In some embodiments, the method comprises executing a plurality of super cycles. A super cycle comprises the step of subjecting the substrate to a plasma pre-treatment, and the step of selectively depositing a material on at least one of the proximal surface and the distal surface with respect to the sidewall.

In some embodiments, the step of selectively depositing a material on at least one of the proximal surface and the distal surface with respect to the sidewall comprises a sub-step of exposing the substrate to a material precursor, and a sub-step of exposing the substrate to a material reactant.

In some embodiments, the method comprises a plurality of deposition cycles. A deposition cycle comprises the sub-step of exposing the substrate to the material precursor, and the sub-step of exposing the substrate to the material reactant.

In some embodiments, the step of subjecting the substrate to a plasma pre-treatment comprises exposing the substrate to a remote fluorine plasma.

In some embodiments, the step of subjecting the substrate to a plasma pre-treatment comprises exposing the substrate to a direct fluorine plasma.

In some embodiments, the material precursor comprises a silicon precursor.

In some embodiments, the silicon precursor comprises an alkylaminosilane.

In some embodiments, the alkylaminosilane comprises an amine group selected from $NH_2$, $NHR^i$, and $NR^iR^{ii}$, with at least one of $R^i$ and $R^{ii}$ being a $C_1$ to $C_4$ alkyl.

In some embodiments, the material reactant comprises an oxygen reactant.

In some embodiments, the sub-step of exposing the substrate to a material reactant comprises exposing the substrate to an oxygen plasma.

In some embodiments, the sub-step of exposing the substrate to a material reactant comprises exposing the substrate to a nitrogen plasma.

In some embodiments, the substrate is maintained at a temperature of at least 10° C. to at most 500° C.

In some embodiments, the reaction chamber is maintained at a pressure of at least 1 Pa to at most 1000 Pa.

In some embodiments, the step of selectively depositing a material on at least one of the proximal surface and the distal surface with respect to the sidewall is done at a growth rate of at least 0.1 Å per sub cycle to at most 10 Å per sub cycle.

In some embodiments, the method further comprises subjecting the substrate to a subsequent plasma treatment. The substrate is exposed to the subsequent plasma treatment after the substrate is subjected to the plasma pre-treatment, and before the step of selectively depositing a material on at least one of the proximal surface and the distal surface with respect to the sidewall.

Further described is a semiconductor processing apparatus. The semiconductor processing apparatus comprises a reaction chamber comprising a substrate support for supporting a substrate comprising one or more gap features; a heater constructed and arranged to heat the substrate in the reaction chamber; a first plasma gas source in fluid communication with the reaction chamber via a first plasma gas valve; a second plasma gas source in fluid connection with the reaction chamber via a second plasma gas valve; a plasma module comprising a radio frequency power source constructed and arranged to generate a plasma in the reaction chamber; one or more silicon precursor sources in fluid connection with the reaction chamber via one or more precursor valves; and, a controller configured for causing the apparatus to perform a method as described herein.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 7:
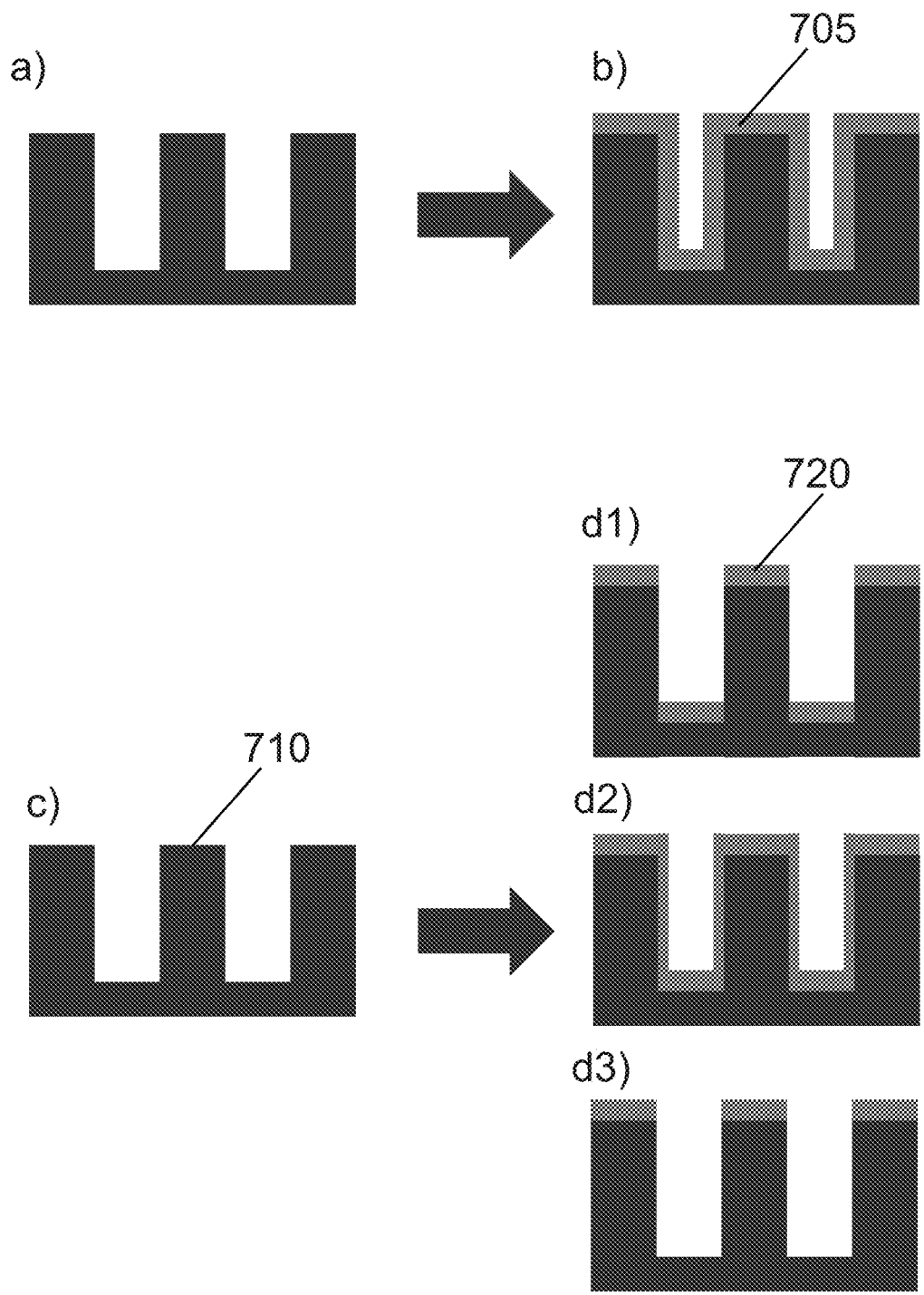

FIG. 7 schematically show structures that result from methods as described herein.

Figure 8:
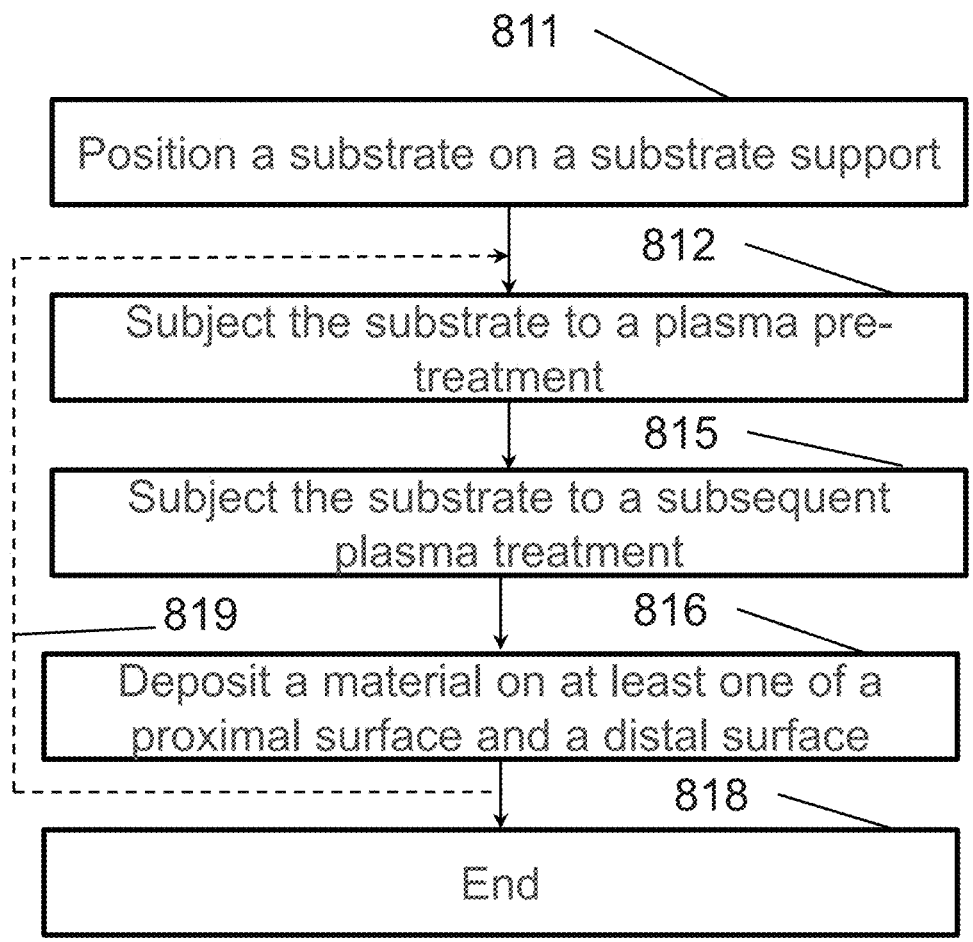

FIG. 8 schematically shows a representation of an embodiment of a method as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas.

In some cases, the term "precursor" can refer to a compound that participates in the chemical reaction that produces another compound, and particularly to a compound that constitutes a film matrix or a main skeleton of a film, or that is incorporated in a film as a constituent part thereof; the term "reactant" may be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor, and can include one or more layers overlying or underlying the bulk material.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "comprising" indicates that certain features are included, but that it does not exclude the presence of other features, as long as they do not render the claim or embodiment unworkable. In some embodiments, the term "comprising" includes "consisting". As used herein, the term "consisting" indicates that no further features are present in the apparatus/method/product apart from the ones following said wording. When the term "consisting" is used referring to a chemical compound, it indicates that the chemical compound only contains the components that are listed.

As used herein, the term "purge" refers to a process step in which precursor and/or reactive species are removed from a reaction chamber. During a purge, an inert or substantially inert gas can be provided to the reaction chamber. Additionally or alternatively, the reaction chamber may be evacuated during a purge.

Described herein is a method for topography-selective deposition of a material on a substrate. Suitable substrates include semiconductor wafers, e.g. silicon wafers. In other words, a method as described herein can advantageously be used to deposit a material on some surface features, and not or to a lesser degree on other surface features, even when all of those surface features are made of the same materials.

Advantageously, a method as described herein can be used for forming an air gap, i.e. an enclosed void, in a substrate. Thus, described herein are methods for forming an air gap. Such methods comprise depositing a material on a substrate by means of a method as described herein.

A suitable substrate comprises a proximal surface and a gap feature. The present methods can be used during the manufacture of various semiconductor devices and are particularly useful for filling gap features such as trenches, recesses, vias, and the like; and having a high aspect ratio and a particularly small width, e.g. having a width smaller than 10 nm and an aspect ratio higher than 2, or 5, or 10, or 20. The proximal surface may be planar, or it may be textured, i.e. the proximal surface can contain a certain topography. A gap feature comprises a sidewall and a distal surface. In some embodiments, for example when the present methods are employed in the field of integrated circuit manufacture, a substrate may contain a plurality of gaps. In such embodiments, the presently described methods can be advantageously employed to simultaneously fill the plurality of gaps comprised in the substrate. In some embodiments, the presently described methods can be advantageously used to selectively deposit a material on at least one of the proximal surface and the distal surface, and not, or to a lesser degree, on the distal surface.

The gap can be comprised in any suitable material, or in any stack of suitable materials. Suitable materials include, but are not limited to, monocrystalline silicon substrates, doped or undoped SiGe layers, and dielectrics. Suitable dielectrics include silicon oxide, silicon nitride, silicon oxycarbide, silicon oxynitride, hafnium oxide, zirconium oxide, and aluminum oxide. In some embodiments, the gap is comprised in an oxide, a nitride, an oxynitride, an oxycarbide, an oxycarbide nitride, and/or the like, such as silicon nitride, silicon oxide ($SiO_2$), silicon carbide and mixtures thereof, such as SiOC, SiOCN, SiON. In some embodiments, the gap is comprised in silicon oxide. It shall be understood that when a gap is comprised in such a material, the proximal surface can suitably comprise a surface of such a material.

A method as described herein comprises a step of positioning the substrate on a substrate support in a reaction chamber and a step of subjecting the substrate to a plasma pre-treatment. Suitable plasma pre-treatments include exposing the substrate to fluorine-containing species such as fluorine-containing molecules, ions, radicals, or a combination thereof.

Without the invention being bound by any particular theory or mode of operation, it is believed that the plasma pre-treatment results in a uniform deactivation of the substrate surface. In other words, it is believed that the plasma pre-treatment causes fluorine chemisorption everywhere on the substrate surface, thereby reducing chemisorption of suitable precursors on the proximal surface, the distal surface, and the sidewalls. Subsequent process steps result in preferential re-activation, i.e. preferential removal of fluorine, of the proximal surface, the distal surface, or both with respect to the sidewalls of the gap.

A suitable further subsequent process step includes a plasma-enhanced deposition process. Suitable plasma enhanced deposition processes are processes that employ a plasma in at least part of the deposition process. A plasma enhanced deposition process includes plasma-enhanced chemical vapor deposition and plasma-enhanced atomic layer deposition. Without the invention being bound by any particular theory or mode of operation, it is believed that plasma employed in such a plasma-enhanced deposition process results in preferential re-activation, i.e. preferential removal of fluorine, of the proximal surface, the distal surface, or both with respect to the sidewalls of the gap.

Another suitable subsequent process step includes a subsequent plasma treatment, such as a treatment using a nitrogen plasma or a noble gas plasma. Suitable noble gas plasmas include helium plasmas, neon plasmas, argon plasmas, krypton plasmas, and xenon plasmas. Without the invention being bound by any particular theory or mode of operation, it is believed that plasma employed in such a subsequent plasma treatment results in preferential re-activation, i.e. preferential removal of fluorine, of the proximal surface, the distal surface, or both with respect to the sidewalls of the gap. After such a subsequent plasma treatment, a material deposition step can be performed. Suitable material deposition steps include thermal depositions and plasma-enhanced depositions. Suitable thermal depositions include chemical vapor deposition and atomic layer deposition. Suitable plasma-enhanced depositions include plasma-enhanced chemical vapor deposition and plasma-enhanced atomic layer deposition.

Thus it is believed that, by virtue of the plasma pre-treatment, and the subsequent selective reactivation of at least one of the proximal surface and the distal surface vis-à-vis the sidewalls, a material can be selectively deposited on the proximal surface, the distal surface, or both with respect to the sidewall. It shall be understood that the step of subjecting the substrate to a plasma pre-treatment precedes step of selectively depositing a material on at least one of the proximal surface and the distal surface with respect to the sidewall. Optionally, a purge step is carried out between the plasma pre-treatment and the step of selectively depositing a material on at least one of the proximal surface and the distal surface with respect to the sidewall. In some embodiments, no plasma is generated in the reaction chamber during the purge. In some embodiments, a plasma is generated in the reaction chamber during the purge.

In some embodiments, a process as described herein results in a passivation gradient, i.e. a gradual change of passivation intensity, from the sidewalls to at least one of the proximal surface and the distal surface. In such a case, the step of depositing a material on at least one of the proximal surface and the distal surface can result in a gradual change in the density of chemisorbed precursor per unit area from at least one of the proximal surface and the distal surface towards the sidewalls. Thus, a material is selectively deposited on at least one on the proximal surface and the distal surface.

The step of exposing the substrate to a material precursor results in preferential chemisorption of the material precursor on the proximal surface, the distal surface, or both. In other words, by exposing the substrate to the material precursor, more material precursor is chemisorbed on at least one of the distal surface and the activated proximal surface compared to the sidewalls. The step of exposing the substrate to a post silicon precursor pulse plasma treatment results in a reaction between one or more reactive species comprised in the plasma on the one hand, and the silicon precursor that chemisorbed on the lower surface during the step of exposing the substrate to a silicon precursor on the other hand. In some embodiments, the method comprises entirely filling the gap feature with the silicon-containing material. This can be done, for example, by repeating the cyclical process until the entire gap feature is filled with the silicon-containing material.

Various materials can be deposited by means of a method as described herein. Suitable materials include metals, alloys, oxides, nitrides, carbides, sulfides, selenides, tellurides, and mixtures thereof. In some embodiments, a material deposited by means of a method as described herein comprises silicon. Exemplary silicon-containing materials include silicon oxide and silicon oxycarbide.

In some embodiments, the step of subjecting the substrate to a plasma pre-treatment comprises exposing the substrate to a remote fluorine plasma. For example, a remote plasma source can be provided with a plasma gas comprising $NF_3$. In some embodiments, the plasma gas comprises nitrogen, fluorine, and a noble gas such as argon (Ar). In some embodiments, the plasma gas comprises $NF_3$ and a noble gas such as Ar. Such a remote plasma source can suitably generate fluorine radicals that can be employed as an active species.

In some embodiments, NF₃ is provided to the remote plasma source at a flow rate of at least 0.01 sccm to at most 1000 sccm, or from at least 0.1 sccm to at most 100 sccm, or from at least 1 sccm to at most 10 sccm.

In some embodiments, a noble gas such as argon is provided to the remote plasma source at a flow rate of at least 0.001 slm to at most 100 slm, or of at least 0.01 slm to at most 10 slm, or of at least 0.1 slm to at most 1 slm.

In some embodiments, the remote plasma source is provided with an RF power source that generates from at least 0.1 kW to at most 10 kW of power, or of at least 0.2 kW to at most 5 kW of power, or of at least 0.5 to at most 2 kW of power.

In some embodiments, the step of subjecting the substrate to a plasma pre-treatment comprises exposing the substrate to a direct fluorine plasma. A direct plasma comprises generating a plasma in a reaction chamber in which a substrate to be treated is present. Conversely, a remote plasma comprises generating a plasma in a plasma source which is positioned adjacent to, or at a certain distance, e.g. 20 cm to 2 m, from a reaction chamber in which a substrate to be treated is present. Suitably, a remote plasma source can be operationally connected to the reaction chamber by means of an active species duct such as a metal tube.

In some embodiments, a method as described herein comprises executing a plurality of super cycles. It shall be understood that a super cycle comprises the step of subjecting the substrate to a plasma pre-treatment, and the step of selectively depositing a material on at least one of the proximal surface and the distal surface with respect to the sidewall.

In some embodiments, the method comprises executing the super cycle from at least 2 times to at most 20 000 times, or from at least 5 times to at most 10 000 times, or from at least 10 times to at most 5 000 times, or from at least 20 times to at most 2 000 times, or from at least 50 times to at most 1000 times, or from at least 100 times to at most 500 times. In some embodiments, the method comprises executing the super cycle from at least 5 times to at most 50 times, or from at least 10 times to at most 20 times. In some embodiments, consecutive super cycles are separated from each other by means of a purge. It shall be understood that, in some embodiments, no plasma is generated in the reaction chamber during the purge.

Selectively depositing a material on at least one of the proximal surface and the distal surface with respect to the sidewall can comprise any one or a combination of a chemical vapor deposition (CVD) process, an atomic layer deposition (ALD) process, a plasma-enhanced ALD (PE-ALD) process, or a plasma-enhanced chemical vapor deposition (PE-CVD) process, or a hybrid form comprising certain aspects of one deposition process, and other aspects of another deposition process.

In some embodiments, the step of selectively depositing a material on at least one of the proximal surface and the distal surface with respect to the sidewall comprises a sub-step of exposing the substrate to a material precursor, and a sub-step of exposing the substrate to a material reactant. Optionally, the sub-step of exposing the substrate to a material precursor and the sub-step of exposing the substrate to a material reactant are separated by an intra-deposition cycle purge.

In some embodiments, the material precursor comprises a silicon precursor and the step of exposing the substrate to a material reactant comprises generating an oxygen-containing plasma in the reaction chamber. Thus, the material can comprise silicon oxide.

In some embodiments, the oxygen-containing plasma comprises $O_2$ and a noble gas such as He, Ne, Ar, Kr, or Xe. In some embodiments, the oxygen-containing plasma comprises Ar and $O_2$. In some embodiments, the $O_2$ content of the oxygen-containing plasma is at most 30 vol. %, or at most 20 vol. %, or at most 10 vol. %, or at most 5 vol. %. In some embodiments, the $O_2$ content of the oxygen-containing plasma is at least 0.1 vol. %. In some embodiments, and while exposing the substrate to the oxygen-containing plasma, the reaction chamber is maintained at a pressure of at most 1000 Pa, at most 500 Pa, at most 200 Pa, at most 100 Pa, at most 50 Pa, at most 20 Pa, at most 10 Pa, at most 5 Pa, at most 2 Pa, or at most 1 Pa. In an advantageous embodiments, the reaction chamber is maintained at a pressure of at least 10 Pa to at most 100 Pa, in which case the $O_2$ plasma is observed to have excellent directionality, which can enhance the selective deposition on at least one of the proximal surface and the distal surface with respect to the sidewalls. In some embodiments, the oxygen-containing plasma is generated by means of an RF generator operating at a plasma power of at least 100 W to at most 700 W, or at a plasma power of at least 400 W to at most 600 W, or at a plasma power of at least 450 W to at most 550 W. In some embodiments, the oxygen plasma is, during an oxygen plasma pulse, generated for at least 0.1 s to at most 10 s, or for at least 0.2 s to at most 5 s, or for at least 0.5 s to at most 2 s. In some embodiments, exposing the substrate to an oxygen plasma is followed by a purge, the purge lasting from at least 0.2 s to at most 10 s, or from at least 1 s to at most 5 s. It shall be understood that no plasma is generated in the reaction chamber during the purge.

In some embodiments, a method as described herein comprises a plurality of deposition cycles. A deposition cycle comprises a sub-step of exposing the substrate to a material precursor, and a sub-step of exposing the substrate to a material reactant. Suitable material reactants include oxygen-containing plasmas, such as a plasma containing from at least 1 to at most 20 vol. % of an oxygen-containing gas such as $O_2$ in a noble gas such as He. Optionally, subsequent deposition cycles are separated by an inter deposition cycle purge. It shall be understood that, in some embodiments, no plasma is generated in the reaction chamber during the purges.

In some embodiments, any one super cycle comprises a plurality of deposition cycles. In some embodiments, a super cycle comprises from at least 2 to at most 1000 deposition cycles, or from at least 2 to at most 5 deposition cycles, or from at least 5 to at most 10 deposition cycles, or from at least 10 to at most 20 deposition cycles, or from at least 20 to at most 50 deposition cycles, or from at least 50 to at most 100 deposition cycles, or from at least 100 to at most 200 deposition cycles, or from at least 200 to at most 500 deposition cycles, or from at least 500 to at most 1000 deposition cycles.

In some embodiments, exposing the substrate to a material precursor lasts for a duration of at least 1 s to at most 20 s, or of at least 2 s to at most 10 s, or of at least 3 s to at most 5 s. In some embodiments, exposing the substrate to a material precursor lasts for at least 0.1 s to at most 20 s, or of at least 0.2 s to at most 10 s, or of at least 0.5 s to at most 5 s, or of at least 1 s to at most 2 s. In some embodiments, exposing the substrate to a material precursor is followed by a purge, the purge having a duration of at least 0.2 s to at most 20 s, or of at least 0.5 s to at most 10 s, or of at least 1 s to at most 5 s. It shall be understood that, in some embodiments, no plasma is generated in the reaction chamber during a purge.

In some embodiments, a method as described herein does not comprise executing any etching steps throughout the process of depositing the material. This can advantageously simplify the presently described processes. In addition, it can further enhance throughput.

Alternatively, and in some embodiments, a method as described herein can further comprise a step of etching an amount of deposited material. Preferably, such etching is done topo-selectively, i.e. the etch occurs preferentially on some topographical units and not, or to a lesser extent, on other topographical units. For example, and in some embodiments, the proximal surfaces may be preferentially etched. Additionally or alternatively, the sidewalls may be preferentially etched. Additionally or alternatively, the distal surface may be preferentially etched.

An etching step may, in some embodiments, be carried out after all material has been deposited. Alternatively, an etching step may be carried out after every super cycle, or after a pre-determined number of super cycles, e.g. after every 2, 5, 10, 20, 50, or 100 super cycles.

Various etching processes, which as such are known in the Art, can be used. Suitable etching processes include reactive ion etches, atomic layer etches, and wet etches.

In some embodiments, the material precursor comprises a silicon precursor.

In some embodiments, the silicon precursor comprises a halosilane. Suitable halosilanes include chlorosilanes such as tetrachlorosilane, trichlorosilane, dichlorosilane, and monochlorosilane. In some embodiments, the chlorosilane comprises dichlorosilane. Additionally or alternatively, the halosilane can comprise a borosilane such as tetraborosilane, triborosilane, diborosilane, or monoborosilane. Additionally or alternatively, the halosilane can comprise a iodosilane such as tetraiodosilane, triiodosilane, diiodosilane, or monoiodosilane.

In some embodiments, the silicon precursor comprises an alkylaminosilane. In some embodiments, the silicon precursor comprises a monosilane, disilane or trisilane comprising one or more amine and/or alkylamine groups. Suitably, the alkylaminosilane comprises an amine group selected from $NH_2$, $NHR^i$, and $NR^iR^{ii}$, with at least one of $R^i$ and $R^{ii}$ being a C1 to C4 alkyl. In some embodiments, both $R^i$ and $R^{ii}$ are a C1 to C4 alkyl. Alternatively, the alkylaminosilane can comprise an amine group selected from $NH_2$, $NHR^i$, and $NR^iR^{ii}$, with at least one of $R^i$ and $R^{ii}$ being a C2 to C4 alkenyl. In some embodiments, both $R^i$ and $R^{ii}$ are a C2 to C4 alkenyl. In some embodiments, $R^i$ and $R^{ii}$ are different. In some embodiments, $R^i$ and $R^{ii}$ are identical.

In some embodiments, the amine group is selected from $NH_2$, $NHR^i$, and $NR^iR^{ii}$. In some embodiments, $R^i$ and $R^{ii}$ are hydrocarbyls. In some embodiments, $R^i$ and $R^{ii}$ are identical. In some embodiments, $R^i$ and $R^{ii}$ are different. In some embodiments, $R^i$ and $R^{ii}$ independently selected from a $C_1$ to $C_4$ alkyl or alkenyl. In some embodiments, at least one of $R^i$ and $R^{ii}$ is a $C_1$ to $C_4$ alkyl.

In some embodiments, the silicon precursor is selected from $SiR^1R^3R^4$—$SiR^2R^5R^6$, $SiR^1R^3R^4$—$SiR^5R^6$—$SiR^2R^2R^8$, and $SiR^1R^3R^4$—$SiR^2R^5$—$SiR^6R^7R^8$. It shall be understood that $R^1$ and $R^2$ are $NR^9R^{10}$, with $R^3$, $R^4$, $R^5$, $R^6$, $R^7$, $R^8$, $R^9$, and $R^{10}$ independently being selected from H and hydrocarbyl. In some embodiments, $R^3$, $R^4$, $R^5$, $R^6$, $R^7$, $R^8$, $R^9$, and $R^{10}$ are independently selected from H, $C_1$ to $C_4$ alkyl, $C_1$ to $C_4$ alkenyl, and $C_4$ to $C_8$ aryl. In some embodiments, $R^3$, $R^4$, $R^5$, $R^6$, $R^7$, $R^8$, $R^9$, and $R^{10}$ are independently selected from H and a $C_1$ to $C_4$ alkyl. In some embodiments, at least one of $R^3$, $R^4$, $R^5$, $R^6$, $R^7$, $R^8$, $R^9$, and $R^{10}$ is H. In some embodiments, at least one of $R^3$, $R^4$, $R^5$, $R^6$, $R^7$, $R^8$, $R^9$, and $R^{10}$ is methyl. In some embodiments, at least one of $R^3$, $R^4$, $R^5$, $R^6$, $R^7$, $R^8$, $R^9$, and $R^{10}$ is ethyl. In some embodiments, at least one of $R^3$, $R^4$, $R^5$, $R^6$, $R^7$, $R^8$, $R^9$, and $R^{10}$ is propyl. In some embodiments, at least one of $R^3$, $R^4$, $R^5$, $R^6$, $R^7$, $R^8$, $R^9$, and $R^{10}$ is isopropyl. In some embodiments, all of $R^3$, $R^4$, $R^5$, $R^6$, $R^7$, $R^8$, $R^9$, and $R^{10}$ are methyl. In some embodiments, the silicon precursor comprises dimethylaminopentamethyldisilane.

In some embodiments, the silicon precursor is selected from $R^1$—$SiH_2$—$SiH_3$, $R^1$—$SiH_2$—$SiH_2$—$SiH_2$—$R^2$, and $R^1$—$SiH_2$—$SiHR^2$—$SiH_3$, in which $R^1$ and $R^2$ are independently selected from $NH_2$, $NHR^9$, and $NR^9R^{10}$, and in which $R^9$ and $R^{10}$ are independently selected from H and a $C_1$ to $C_4$ hydrocarbyl. In some embodiments, $R^9$ and $R^{10}$ are independently selected from H, $C_1$ to $C_4$ alkyl, $C_1$ to $C_4$ alkenyl, and $C_4$ to $C_8$ aryl. In some embodiments, $R^9$ and $R^{10}$ are independently selected from H and a $C_1$ to $C_4$ alkyl. In some embodiments, at least one of $R^9$ and $R^{10}$ is H. In some embodiments, at least one of $R^9$ and $R^{10}$ is methyl. In some embodiments, least one of $R^9$ and $R^{10}$ is ethyl. In some embodiments, at least one of $R^9$ and $R^{10}$ is propyl. In some embodiments, at least one of $R^9$ and $R^{10}$ is isopropyl. In some embodiments, $R^9$ and $R^{10}$ are methyl. In some embodiments, at least one of $R^3$ and $R^4$ is a $C_1$ to $C_4$ alkyl. In some embodiments, the silicon precursor comprises an alkylaminosilane selected from diisopropylaminodisilane, and disecbutylaminodisilane.

In some embodiments, the silicon precursor comprises an akylaminosilane such as bisdiethylaminosilane diisopropylaminosilane, diisopropylaminotrisilylamine, diisopropylaminodisilane, dimethylaminopentamethyldisilane, or disec-butylaminodisilane.

In some embodiments, the alkylaminosilane comprises bis(dimethylamino)silane. In some embodiments, the alkylaminosilane comprises bis(diethylamino)silane. In some embodiments, the alkylaminosilane comprises bis(di-isopropylamino)silane. In some embodiments, the alkylaminosilane comprises bis(dipropylamino)silane. In some embodiments, the alkylaminosilane comprises bis(dibutylamino)silane.

In some embodiments, the silicon precursor comprises one or more alkylsilyl-substituted linear or cyclic secondary amines, alkylsilazanes, and aminoalkyl-substituted alkoxysilanes. Exemplary silicon precursors include N-methylaza-2,2,4-trimethylsilacyclopentane, hexamethyldisilazane, (3-aminopropyl)trimethoxysilane, and 3-methoxypropyltrimethoxysilane.

In some embodiments, the silicon precursor selected from the list comprising diisopropylaminotrisilylamine, diisopropylaminodisilane, dimethylaminopentamethyldisilane, and disec-butylaminodisilane. Such silicon precursors can allow for a high growth per cycle, and can maximize the differences in growth per cycle between the upper surface in the gap and the lower surface in the gap.

In some embodiments, the silicon precursor comprises an amino-substituted cyclosiloxane, for example alkyl- and amino-substituted cyclosiloxane such as 2-diethylamino-2,4,6,8-tetramethylcyclotetrasiloxane. Such silicon precursors can allow for a high growth per cycle, and can maximize the differences in growth per cycle between the upper surface in the gap and the lower surface in the gap.

In some embodiments, the silicon precursor comprises one or more alkylsilyl-substituted linear or cyclic secondary amines, alkylaminosilanes, alkylsilazanes, alkylsilanes, or aminoalkyl-substituted alkoxysilanes.

In some embodiments, the silicon precursor comprises an alkyl-substituted or unsubstituted heterocyclic compound comprising C, N, and Si in its ring structure, such as N-methyl-aza-2,2,4-trimethylsilacyclopentane.

In some embodiments, the silicon precursor comprises an alkylsilane such as hexamethyldisilazane.

In some embodiments, the silicon precursor comprises an aminoalkyl-substituted alkoxysilane such as (3-aminopropyl)trimethoxysilane.

In some embodiments, the silicon precursor comprises an alkoxysilane such as 3-methoxypropyltrimethoxysilane.

In some embodiments, in particular when the substrate is subjected to a subsequent plasma treatment after the plasma pre-treatment and before the material deposition step, the material reactant can comprise an oxygen reactant. Exemplary oxygen reactants include $O_2$, $H_2O_2$, $CO_2$, $N_2O$, and $O_3$.

In some embodiments, the sub-step of exposing the substrate to a material reactant comprises exposing the substrate to a direct oxygen plasma and the plasma gas comprises $O_2$. In some embodiments, $O_2$ is provided to the reaction chamber at a flow rate of a least 100 sccm to at most 10 000 sccm, or at a flow rate of at least 200 sccm to at most 5000 sccm, or at a flow rate of at least 500 sccm to at most 1000 sccm. In some embodiments, the oxygen plasma is generated by means of an RF generator operating at a plasma power of at least 50 W to at most 200 W. In some embodiments, the oxygen plasma is, during an oxygen plasma pulse, generated for at least 0.1 s to at most 10 s, or for at least 0.2 s to at most 5 s, or for at least 0.5 s to at most 2 s. In some embodiments, exposing the substrate to an oxygen plasma is followed by a purge, the purge lasting from at least 0.2 s to at most 10 s, or from at least 1 s to at most 5 s. It shall be understood that no plasma is generated in the reaction chamber during the purge.

In some embodiments, the sub-step of exposing the substrate to a material reactant comprises exposing the substrate to a nitrogen plasma. In some embodiments, the nitrogen plasma is a direct nitrogen plasma. In such embodiments, the sub-step of exposing the substrate to a material reactant comprises providing a nitrogen-containing gas to the reaction chamber while generating a plasma in the reaction chamber. Exemplary nitrogen-containing gasses include $N_2$, $N_2H_2$, and $NH_3$.

In some embodiments, the substrate is maintained at a temperature of at least −10° C. to at most 500° C., or at a temperature of at least 20° C. to at most 300° C., or at a temperature of at least 50° C. to at most 200° C., or at a temperature of at least −20° C. to at most 150° C., or at a temperature of at least 0° C. to at most 100° C., or at a temperature of at least 20° C. to at most 50° C.

In some embodiments, the reaction chamber is maintained at a pressure of at least 0.1 Pa to at most 1000 Pa, or at a pressure of at least 0.1 Pa to at most 0.2 Pa, or of at least 0.2 Pa to at most 0.5 Pa, or of at least 0.5 Pa to at most 1 Pa, or of at least 1 Pa to at most 2.0 Pa, or of at least 2.0 Pa to at most 5 Pa, or of at least 5 Pa to at most 10 Pa, or of at least 10 Pa to at most 20 Pa, or of at least 20 Pa to at most 50 Pa, or of at least 50 Pa to at most 100 Pa, or of at least 100 Pa to at most 200 Pa, or of at least 200 Pa to at most 500 Pa, or of at least 500 Pa to at most 1000 Pa.

In some embodiments, the step of selectively depositing a material on at least one of the proximal surface and the distal surface with respect to the sidewall is done at a growth rate of at least 0.1 Å per sub cycle to at most 10 Å per sub cycle.

In some embodiments, the step of selectively depositing a material with respect to the sidewalls on at least one of the proximal surface and the distal surface is done at a growth rate of at least 0.1 Å/cycle to at most 10 Å/cycle, for example a growth rate of from at least 0.2 Å/cycle to at most 3 Å/cycle, or from at least 0.3 to at most 1 Å/cycle. For example, the material is deposited on the lower surface at a growth rate of 0.49 Å/cycle. In some embodiments, the growth rate on at least one of the proximal surface and the distal surface is from at least 2 to at most 20 times faster than the growth rate on the sidewalls. In some embodiments, the growth rate on at least one of the proximal surface and the distal surface is from at least 2 to at most 5 times faster than the growth rate on the sidewalls. In some embodiments, the growth rate on at least one of the proximal surface and the distal surface is from at least 5 to at most 10 times faster than the growth rate on the sidewalls. In some embodiments, the growth rate on at least one of the proximal surface and the distal surface is from at least 10 to at most 20 times faster than the growth rate on the sidewalls. In some embodiments, the growth rate on the sidewalls is less than 0.1 Å/cycle. In some embodiments, the growth rate on the sidewalls is 0 Å/cycle.

It shall be understood that, in some embodiments, the aforementioned growth rates can refer to average growth rates as considered throughout a method as described herein. Indeed, in practice, the growth rate can vary from cycle to cycle. For example, silicon oxide may be selectively grown on a proximal surface and a distal surface with respect to a side wall by means of a plasma-enhanced atomic layer deposition (PEALD) process after a fluorine plasma surface passivation step at 25° C. The silicon oxide growth rate on the proximal surface and the distal surface can be around 0 Å/cycle directly after exposing the substrate to the fluorine plasma. During the PEALD process, the growth rate on the proximal surface and the distal surface gradually increases to around 1.2 Å/cycle, while the growth rate on the sidewalls stays at around 0 Å/cycle, for example at 0.1 Å/cycle.

Further described herein is a semiconductor processing apparatus. The semiconductor processing apparatus comprises a reaction chamber. The reaction chamber comprises a substrate support that is arranged for supporting a substrate. The substrate comprises one or more gap features. The semiconductor processing apparatus further comprises a heater that is constructed and arranged to heat the substrate in the reaction chamber. The semiconductor processing apparatus further comprises a first plasma source. The first plasma source is in fluid communication with the reaction chamber via a first plasma gas valve. The semiconductor processing apparatus further comprises a second plasma gas source in fluid connection with the reaction chamber via a second plasma gas valve. The semiconductor processing apparatus further comprises a plasma module. The plasma module comprises a radio frequency power source that is constructed and arranged to generate a plasma in the reaction chamber. The semiconductor processing apparatus further comprises one or more material precursor sources, such as one or more silicon precursor sources, that are in fluid connection with the reaction chamber via one or more precursor valves. The semiconductor processing apparatus further comprises a controller. The controller is configured for causing the apparatus to perform a method as described herein.

Optionally, the semiconductor processing apparatus is configured for providing the material precursor to the reaction chamber by means of a carrier gas. Suitable carrier gasses include noble gasses. In other words, in some embodiments, the semiconductor processing system comprises a gas injection system comprising a precursor delivery system that employs a carrier gas for carrying the material precursor to one or more reaction chambers.

Figure 1:
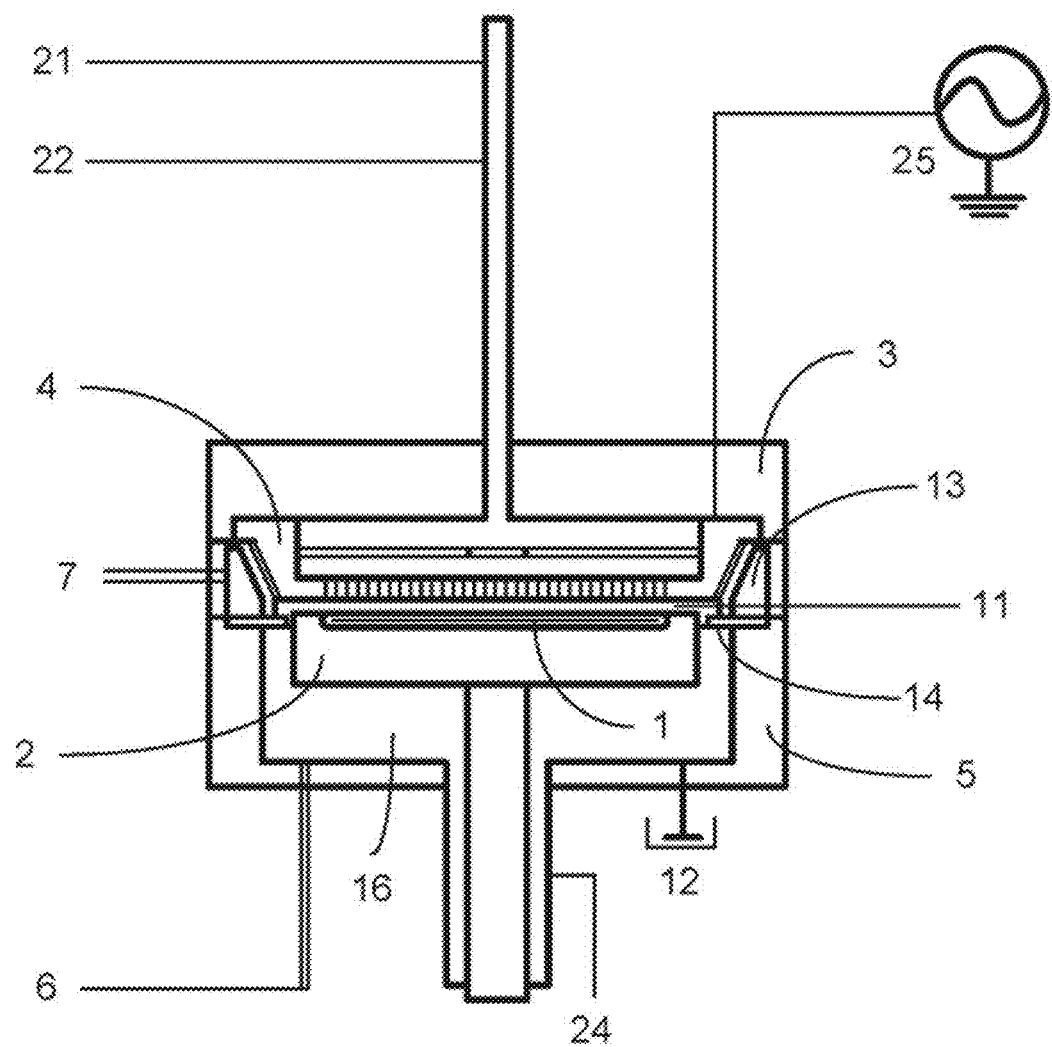
FIG. 1 shows an embodiment of a semiconductor processing system.

The presently provided methods may be executed in any suitable apparatus, including in an embodiment of a semiconductor processing system as shown in FIG. 1. FIG. 1 is a schematic view of a plasma-enhanced atomic layer deposition (PEALD) apparatus, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma can be generated between the electrodes. Of course, and in some embodiments, the semiconductor processing apparatus can be configured for generating a plasma intermittently. For example, there may be no need for the semiconductor processing apparatus to generate a plasma during the steps when a precursor is provided to the reaction chamber, or during purges between subsequent processing steps, and no RF power need be applied to any one of the electrodes during those steps or purges. A temperature regulator may be provided in a lower stage (2), i.e. the lower electrode. A substrate (1) is placed thereon and its temperature is kept constant at a given temperature. The upper electrode (4) can serve as a shower plate as well, and various gasses such as a plasma gas, a reactant gas and/or a dilution gas, if any, as well as a precursor gas can be introduced into the reaction chamber (3) through a first gas line (21) and a second gas line (22), respectively, and through the shower plate (4). Additionally, in the reaction chamber (3), a circular duct (13) with an exhaust line (17) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6). In some embodiments, the deposition of the material and the surface treatment are performed in the same reaction space, so that all the steps can be conducted without any need for intermediate steps of evacuating reaction chambers, pumping down reaction chambers, or exposing the substrate to atmospheric air.

Figure 2:
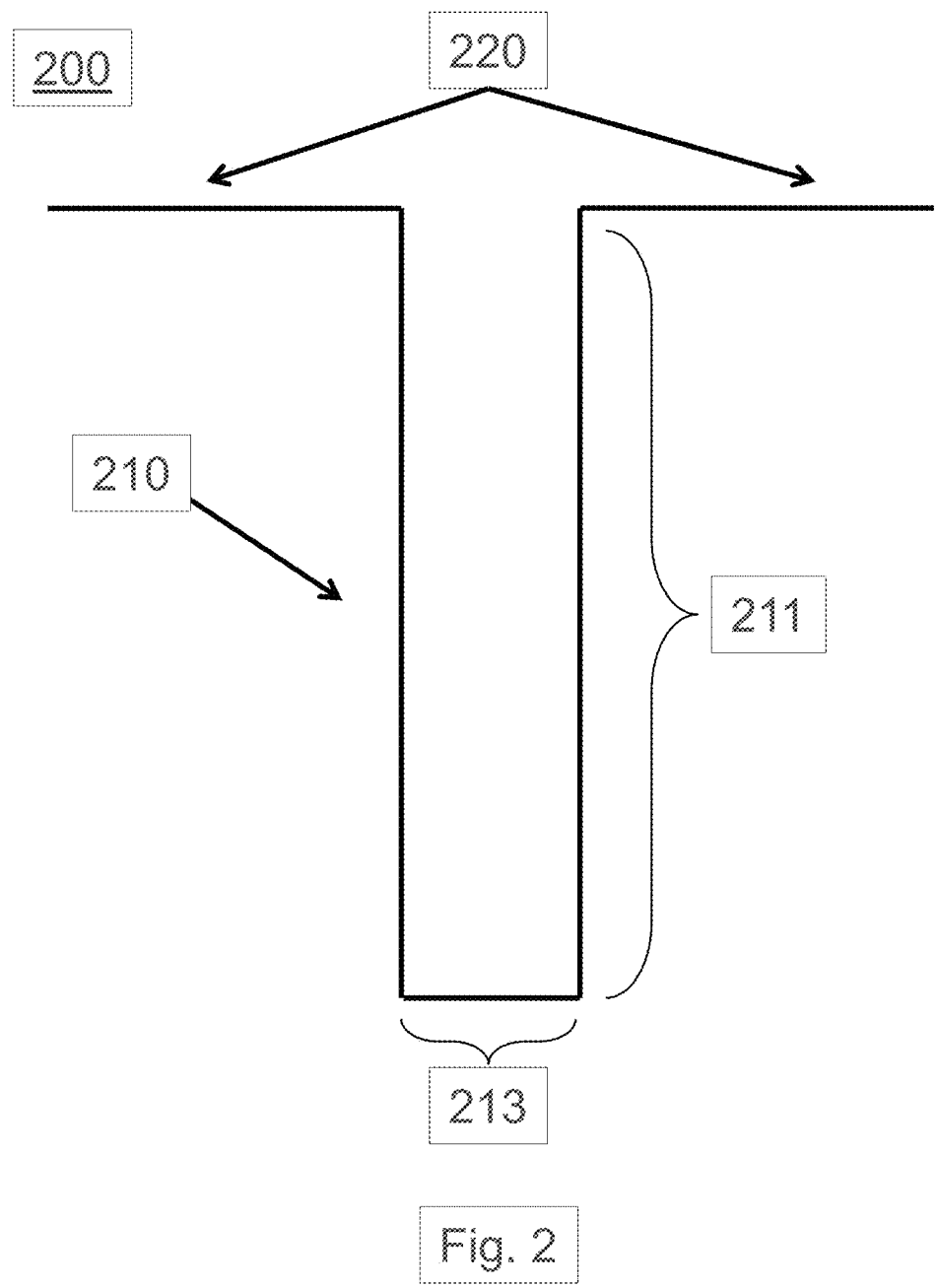
FIG. 2 shows a schematic representation of a substrate (200) comprising a gap feature (210).

FIG. 2 shows a schematic representation of a substrate (200) comprising a gap feature (210). The gap feature (210) comprises a sidewall (211) and a distal surface (213). The substrate (200) further comprises a proximal surface (220) outside of the gap feature (210). By subjecting the substrate (200) to a plasma treatment, at least one of the distal surface (213) and the proximal surface (220) can be activated with respect to the sidewalls (211). In other words, a plasma treatment as disclosed herein can suitably render at least one of a proximal surface (220) and a distal surface (213) relatively reactive towards a suitable precursor compared to the sidewalls (211).

Figure 3:
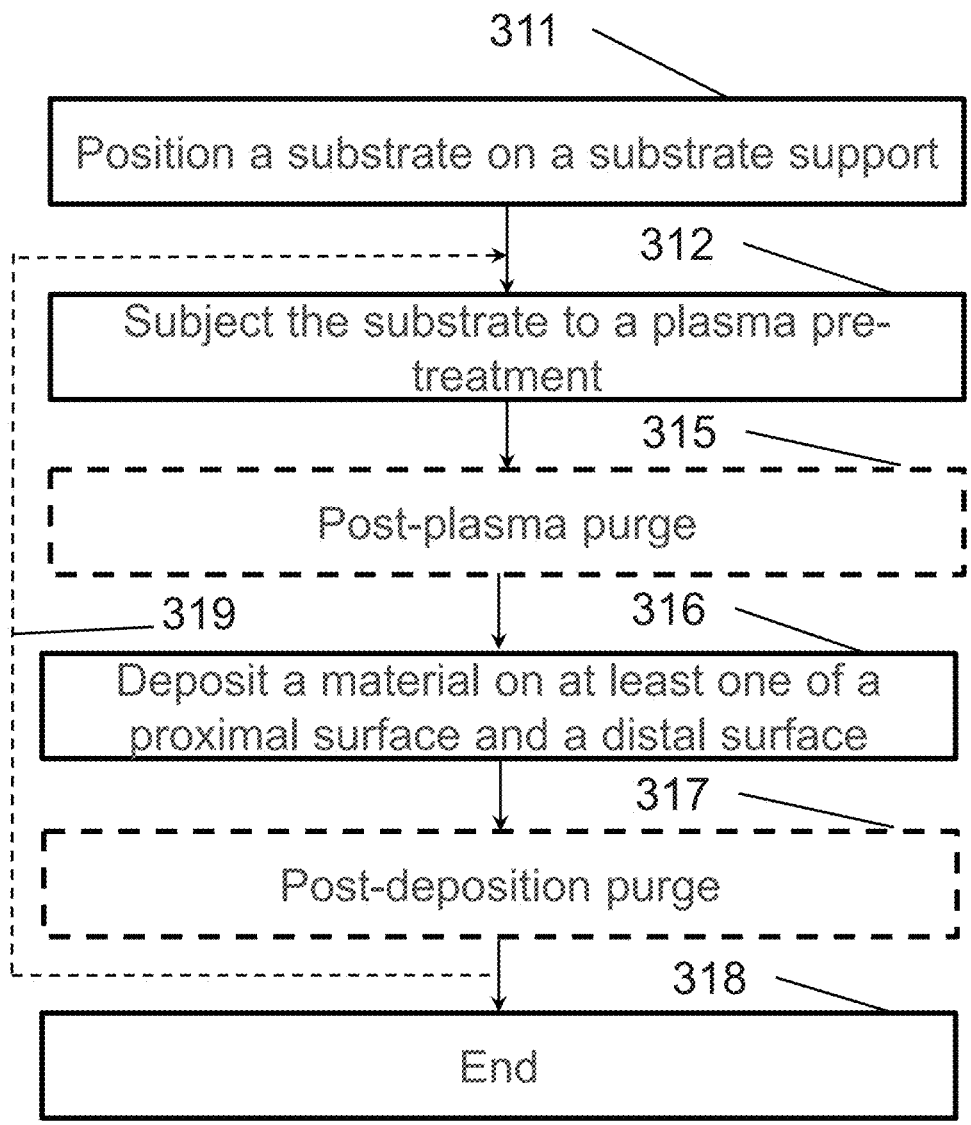
FIG. 3 shows a schematic representation of an embodiment of a method as described herein.

FIG. 3 shows a schematic representation of an embodiment of a method as described herein. The method allows selectively depositing a material on at least one of a proximal surface and a distal surface. It shall be understood that in some embodiments, the material is deposited on the proximal surface only. In other embodiments, the material is deposited on the distal surface only. In other embodiments, the material is deposited on both the proximal surface and the distal surface. In some embodiments, a certain amount of material is deposited on the sidewalls, though the amount of material deposited on the sidewalls is less than the amount of material that is deposited on the proximal surface and the distal surface. The method comprises a step (311) of positioning a substrate on a substrate support. The substrate comprises a gap feature and a proximal surface. The gap feature comprises a distal surface and a sidewall, as shown in FIG. 2. The substrate is then subjected to a plasma pre-treatment (312) as described herein. Optionally, the reaction chamber is then purged using a post-plasma purge (315). Purging can be done, for example, by means of a noble gas. Exemplary noble gasses include He, Ne, Ar, Xe, and Kr. The method further comprises a step (316) of selectively depositing a material on at least one of the proximal surface and the distal surface versus the sidewall, by means of a technique as described herein. Optionally, the reaction chamber is then purged using a post-deposition purge (317). It shall be understood that no plasma is generated in the reaction chamber during the purges. The steps from subjecting the substrate to a plasma treatment (312) to the step of depositing a material on at least one of the proximal surface and the distal surface (316) can optionally be repeated (319) one or more times, thereby resulting in a plurality of super-cycles comprising subsequent plasma treatments followed by a deposition step. Optionally, subsequent super-cycles are separated by a purge. Thus, a material is deposited on at least one of the proximal surface and the distal surface with respect to the sidewalls. When a desired amount of material has been deposited on at least one of the proximal surface and the distal surface, the method ends (318).

In the process of FIG. 3, a plasma pre-treatment was used before every step of depositing a material. Alternatively, the plasma pre-treatment can be repeated only every few deposition steps, e.g. every 3 deposition steps, every 5 deposition steps, every 10 deposition steps, every 20 deposition steps, or every 50 deposition steps. Such an alternative process flow can advantageously enhance throughput and reduce plasma-induced damage, though this can come at the expense of selectivity.

Figure 4:
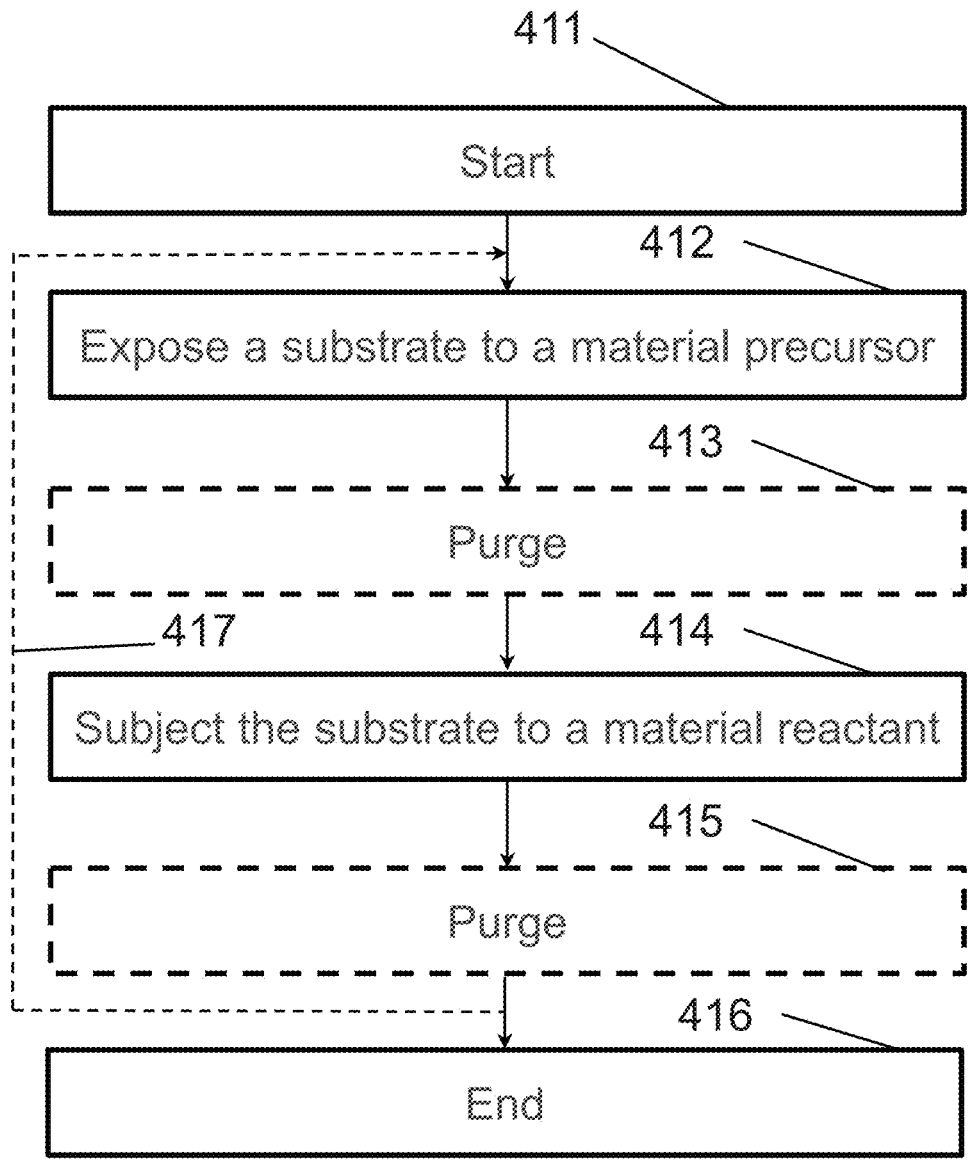
FIG. 4 shows a schematic representation of an embodiment of a part of a method for selectively depositing a material on at least one of a proximal surface and a distal surface with respect to a sidewall.

FIG. 4 shows a schematic representation of an embodiment of a part of a method for selectively depositing a material on at least one of a proximal surface and a distal surface with respect to a sidewall. The part of the method shown in FIG. 4 corresponds to the step of depositing a material on at least one of the proximal surface and the distal surface with respect to the sidewall as shown in FIG. 3. The method of FIG. 4 starts (411) after a step of subjecting the substrate to a plasma treatment, or optionally after a purge following such a step. The substrate is exposed to a precursor (412) that selectively chemisorbs on at least one of the proximal surface and the distal surface with respect to the sidewalls, as described herein. Optionally, the reaction chamber is then purged (413). The method then comprises a step of exposing the substrate to a material reactant (414). In some embodiments, the step of exposing the substrate to a material reactant (414) comprises exposing the substrate to a plasma, for example at least one of a remote or direct nitrogen plasma and a remote or direct oxygen plasma. Optionally, the reaction chamber is purged (415) after the step of exposing the substrate to a material reactant (414). It shall be understood that no plasma is generated in the reaction chamber during the purges. In some embodiments, no plasma is generated in the reaction chamber during any one of the steps of the method in FIG. 4. The steps from exposing the substrate to a material precursor (412) to exposing the substrate to a material reactant (414), including the optional purges, can optionally be repeated (417) one or more times, thereby resulting in a plurality of sub-cycles. Thus, a material is selectively deposited on at least one of the proximal surface and the distal surface with respect to the sidewalls. When a desired amount of material is deposited on at least one of the proximal surface and the distal surface, the method of FIG. 4 ends (416). Optionally, further super cycles can then be carried out to continue the selective deposition, as shown in FIG. 3. Such super cycles can comprise carrying out the method of FIG. 4 one or more further times.

Figure 5:
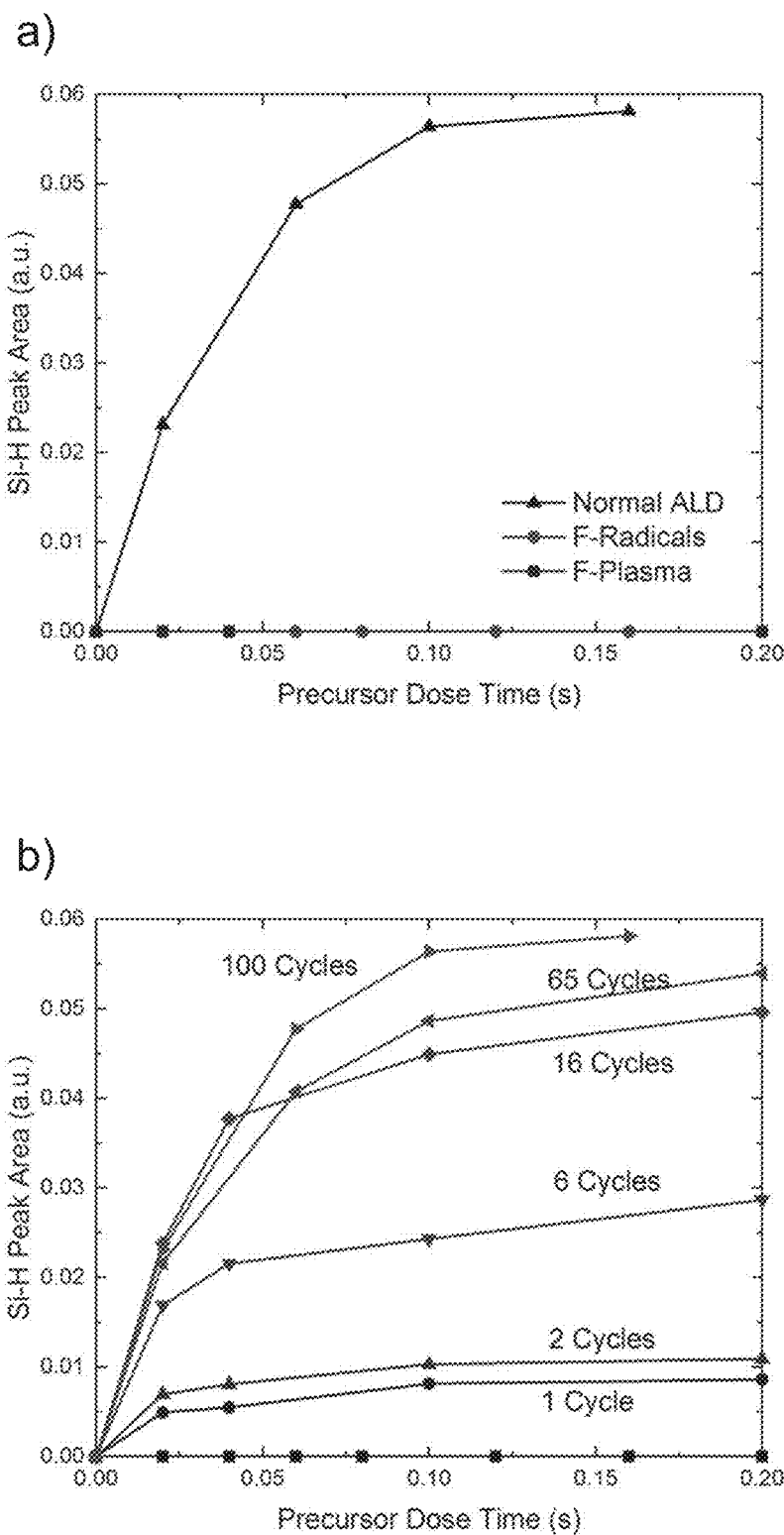
FIG. 5 shows experimental results obtained using an embodiment of a method as described herein.

FIG. 5 shows experimental results obtained using an embodiment of a method as described herein. In particular, FIG. 5 contains two panels: panel a) and panel b). Panel a) shows saturation curves obtained using an ALD process for depositing $SiO_2$. Bisdiethylaminosilane was used as a material precursor, and a direct $O_2$ plasma was used as a material reactant. The direct $O_2$ plasma employed a plasma gas comprising $O_2$ and He, though He can be substituted by another noble gas such as Ar. A suitable ALD process for depositing silicon oxide is described in Dingernans, G., et al. "Plasma-assisted ALD for the conformal deposition of $SiO_2$: process, material and electronic properties." *Journal of the Electrochemical Society* 159.3 (2012): H277. The saturation curves were obtained on an untreated wafer (triangles), after exposing the wafer to fluorine radicals obtained from a remote plasma (circles), and after exposing the wafer to fluorine ions obtained by means of a direct plasma (squares). The saturation curves were obtained by means of Fourier Transform Infrared Spectroscopy (FTIR) measurements, using the Si—H peak, which can be used as a measure for saturation of precursor chemisorption. A remote microwave plasma at 2.45 GHz using $SF_6$ at 4 Pa and 50 W was used as a remote plasma, though another fluorine-containing gas such as $NF_3$ can be used as a fluorine source instead of $SF_6$. As a direct plasma, a capacitively coupled plasma was used using $SF_6$, and RF power at 60 MHz and 50 W. The measurements indicate that whereas the precursor chemisorbs on an untreated wafer's surface, the precursor does not substantially chemisorb on the wafer's surface after that surface has been exposed to fluorine radicals or ions. Panel b) shows saturation curves measured after exposing a substrate to various numbers of deposition cycles. Just after exposing the substrate to fluorine radicals or ions, the substrate is substantially inhibited and precursor does not chemisorb on the wafer's surface. Upon carrying out deposition cycles, the substrate's inhibition is gradually lost until, after about 100 deposition cycles, the substrate substantially behaves as if it hadn't undergone an inhibition step at all.

Figure 6:
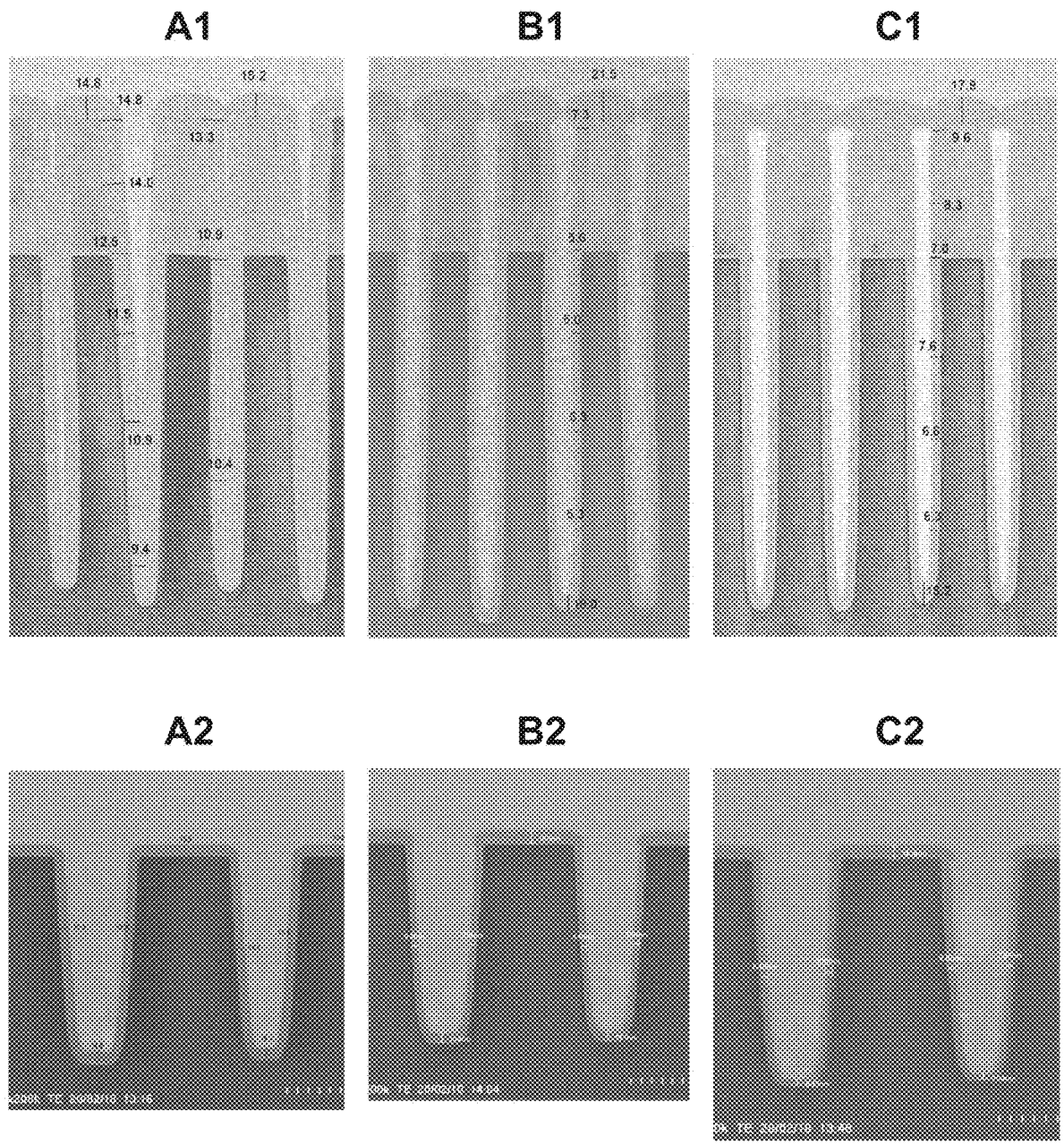
FIG. 6 shows transmission electron microscopy (TEM) micrographs of samples that were treated using a method as described herein.

FIG. 6 shows transmission electron microscopy (TEM) micrographs of samples that were treated using a method as described herein. All samples were subjected to an atomic layer deposition (ALD) process for depositing silicon oxide. Bisdiethylaminosilane was used as a material precursor, and an oxygen plasma was used as a material reactant. The oxygen plasma employed a plasma gas comprising $O_2$. The silicon oxide deposition process as such, not including the plasma pre-treatment, used for these samples is described in Dingemans, G., et al. "Plasma-assisted ALD for the conformal deposition of $SiO_2$: process, material and electronic properties." *Journal of the Electrochemical Society* 159.3 (2012): H277. In particular, FIG. 6 contains six panels: panel A1, panel A2, panel B1, panel B2, panel C1, and panel C2. Panels A1, B1, and C1 show material that was deposited on a test structure that comprises narrow gaps formed in a $SiO_2$ layer on a monocrystalline Si substrate. Panels A2, B2, and C2 show material that was deposited on a test structure that comprises relatively wide gaps formed in a monocrystalline Si substrate.

Panels A1 and A2 show silicon oxide deposited on an untreated substrate: the silicon oxide layer is conformally deposited. Panel B1 and B2 show silicon oxide deposited using 10 super cycles comprising a step of exposing the substrate to fluorine radicals, and performing 30 deposition cycles. A deposition cycle comprises exposing the substrate to a silicon precursor, a post precursor purge, exposing the substrate to a direct oxygen plasma, and a post plasma purge. The material of panel B1 was not exposed to an etching step after deposition. The materials in panels B1 and B2 are grown using identical processes, but the materials were deposited on different structures. Most silicon oxide, 21.5 nm for panel B1, is deposited on the top of the test structure, i.e. on the proximal surface. Less silicon oxide, 10 nm for panel B1, is deposited on the bottom of the gaps comprised in the test structure. Only a small amount of silicon oxide, ca. 5 nm for panel B1, is deposited on the sidewalls of the gaps comprised in the test structure. Panels C1 and C2 show silicon oxide deposited using 10 super cycles. The materials in panels C1 and C2 are grown using identical processes, but the materials were deposited on different structures. A super cycle comprises a step of exposing the substrate to fluorine ions by means of a direct fluorine plasma, and performing 30 deposition cycles. A deposition cycle comprises exposing the substrate to a silicon precursor, a post precursor purge, exposing the substrate to a direct oxygen plasma, and a post plasma purge. Silicon oxide is preferentially deposited on the top of the test structure such that 17.8 nm of silicon oxide yields the formation of an air gap in the narrow test structure of panel C1. In the test structure of panel C1, 15.2 nm of silicon oxide is deposited on the bottom of the gaps, i.e. on the distal surface, and only around 7 nm of silicon oxide is deposited on the sidewalls of the gaps.

Without the present invention being bound by any particular theory or mode of operation, it is believed that exposing the substrate to fluorine-containing active species such as fluorine ions or radicals can advantageously alter the substrate's surface termination selectively on a proximal surface or a distal surface, and not on sidewalls. Thus, surface terminations can be advantageously altered in a selective way, and topographically selective depositions can be achieved.

FIG. 7 schematically shows structures that can be formed by means of methods as described herein, and compares those to structures according to the State of the Art. In particular, panels a) and c) show a substrate (710) prior to deposition. Panel b) shows how a conformal layer (705) can be deposited on the substrate (710) using an atomic layer deposition process known in the Art. The conformal layer (705) has a thickness that is substantially equal everywhere on the substrate's surface. In other words, the conformal layer's thickness is about the same on proximal surfaces, on distal surfaces, and on sidewalls. Panels d1, d2, and d3 show substrates (710) on which material (720) has been deposited by means of a method as described herein. In particular, panel d1 shows how material is selectively deposited on proximal surfaces and distal surfaces with a high degree of selectivity: little to substantially no material is deposited on sidewalls. Panel d2 shows how material is selectively deposited on proximal surfaces and distal surfaces with a lesser degree of selectivity: while more material is deposited on proximal surfaces and distal surfaces compared to the sidewalls, a lower nonzero amount of material is deposited on the sidewalls. Panel d3 shows how material is selectively deposited on the proximal surfaces whereas substantially less or even no material is deposited on the sidewalls or on the distal surfaces.

FIG. 8 schematically shows a representation of an embodiment of a method as described herein. The method of FIG. 8 is similar to that of FIG. 3: it comprises a step (811) of positioning a substrate on a substrate support, a step (812) of subjecting the substrate to a plasma pre-treatment, a step (816) of depositing a material on at least one of a proximal surface and a distal surface, and optionally repeating (816) the steps from subjecting the substrate to the plasma pre-treatment and depositing a material on at least one of a proximal surface and a distal surface. In addition, the method of FIG. 8 comprises a step (815) of subjecting the substrate to a subsequent plasma treatment, for example a treatment using a nitrogen plasma or a noble gas plasma. The step (815) of subjecting the substrate to a subsequent plasma treatment is carried out after the step (812) of subjecting the substrate to a plasma pre-treatment and before the step (816) of depositing a material on at least one of a proximal surface and a distal surface. Any subsequent steps can be separated by a purge. When a desired amount of material is deposited on at least one of a proximal surface and a distal surface, the method ends (818).

The example embodiments of the disclosure described herein do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method for topography-selective deposition of a material on a substrate, the substrate comprising a proximal surface and a gap feature, the gap feature comprising a sidewall and a distal surface, the method comprising, in the given order:
a step of positioning the substrate on a substrate support in a reaction chamber;
a step of subjecting the substrate to a plasma pre-treatment; and
a step of selectively depositing a material on at least one of the proximal surface and the distal surface with respect to the sidewall;
wherein the step of subjecting the substrate to the plasma pre-treatment comprises exposing the substrate to at least one of fluorine-containing molecules, ions, and radicals; and
wherein the step of selectively depositing the material on at least one of the proximal surface and the distal surface with respect to the sidewall comprises a sub-step of exposing the substrate to a material precursor, and a sub-step of exposing the substrate to a material reactant.

2. The method according to claim 1 comprising executing a plurality of super cycles, a super cycle comprising the step of subjecting the substrate to the plasma pre-treatment, and the step of selectively depositing the material on at least one of the proximal surface and the distal surface with respect to the sidewall.

3. The method according to claim 1 comprising a plurality of deposition cycles, a deposition cycle comprising the sub-step of exposing the substrate to the material precursor, and the sub-step of exposing the substrate to the material reactant.

4. The method according to claim 3 wherein the material reactant comprises an oxygen reactant.

5. The method according to claim 3 wherein the sub-step of exposing the substrate to the material reactant comprises exposing the substrate to an oxygen plasma.

6. The method according to claim 3 wherein the sub-step of exposing the substrate to the material reactant comprises exposing the substrate to a nitrogen plasma.

7. The method according to claim 1 wherein the step of subjecting the substrate to the plasma pre-treatment comprises exposing the substrate to a remote fluorine plasma.

8. The method according to claim 1 wherein the step of subjecting the substrate to the plasma pre-treatment comprises exposing the substrate to a direct fluorine plasma.

9. The method according to claim 1 wherein the material precursor comprises a silicon precursor.

10. The method according to claim 9 wherein the silicon precursor comprises an alkylaminosilane.

11. The method according to claim 10 wherein the alkylaminosilane comprises an amine group selected from $NH_2$, $NHR^i$, and $NR^iR^{ii}$, with at least one of $R^i$ and $R^{ii}$ being a $C_1$ to $C_4$ alkyl.

12. The method according to claim 1 wherein the substrate is maintained at a temperature of at least 10° C. to at most 500° C.

13. The method according to claim 1 wherein the reaction chamber is maintained at a pressure of at least 1 Pa to at most 1000 Pa.

14. The method according to claim 1 wherein the step of selectively depositing the material on at least one of the proximal surface and the distal surface with respect to the sidewall is done at a growth rate of at least 0.1 Å per sub cycle to at most 10 Å per sub cycle.

15. The method according to claim 1 wherein the method further comprises subjecting the substrate to a subsequent plasma treatment, wherein the substrate is exposed to the subsequent plasma treatment after the substrate is subjected to the plasma pre-treatment, and before the step of selectively depositing the material on at least one of the proximal surface and the distal surface with respect to the sidewall.

16. A semiconductor processing apparatus comprising:
a reaction chamber comprising a substrate support for supporting a substrate comprising one or more gap features;
a heater constructed and arranged to heat the substrate in the reaction chamber;
a first plasma gas source in fluid communication with the reaction chamber via a first plasma gas valve;
a second plasma gas source in fluid connection with the reaction chamber via a second plasma gas valve;
a plasma module comprising a radio frequency power source constructed and arranged to generate a plasma in the reaction chamber;
one or more silicon precursor sources in fluid connection with the reaction chamber via one or more precursor valves; and,
a controller configured for causing the apparatus to perform a method according to claim 1.

17. A method for topography-selective deposition of a material on a substrate, the substrate comprising a proximal surface and a gap feature, the gap feature comprising a sidewall and a distal surface, the method comprising, in the given order:
- a step of positioning the substrate on a substrate support in a reaction chamber;
- a step of subjecting the substrate to a plasma pre-treatment;
- a step of selectively depositing a material on at least one of the proximal surface and the distal surface with respect to the sidewall; and
- executing a plurality of super cycles, a super cycle comprising the step of subjecting the substrate to the plasma pre-treatment, and the step of selectively depositing the material on at least one of the proximal surface and the distal surface with respect to the sidewall;
- wherein the step of subjecting the substrate to the plasma pre-treatment comprises exposing the substrate to at least one of fluorine-containing molecules, ions, and radicals.

18. A method for topography-selective deposition of a material on a substrate, the substrate comprising a proximal surface and a gap feature, the gap feature comprising a sidewall and a distal surface, the method comprising, in the given order:
- a step of positioning the substrate on a substrate support in a reaction chamber;
- a step of subjecting the substrate to a plasma pre-treatment; and
- a step of selectively depositing a material on at least one of the proximal surface and the distal surface with respect to the sidewall;
- wherein the step of subjecting the substrate to the plasma pre-treatment comprises exposing the substrate to at least one of fluorine-containing molecules, ions, and radicals; and
- wherein the substrate is maintained at a temperature of at least 10° C. to at most 500° C.

19. A method for topography-selective deposition of a material on a substrate, the substrate comprising a proximal surface and a gap feature, the gap feature comprising a sidewall and a distal surface, the method comprising, in the given order:
- a step of positioning the substrate on a substrate support in a reaction chamber;
- a step of subjecting the substrate to a plasma pre-treatment; and
- a step of selectively depositing a material on at least one of the proximal surface and the distal surface with respect to the sidewall; and
- subjecting the substrate to a subsequent plasma treatment, wherein the substrate is exposed to the subsequent plasma treatment after the substrate is subjected to the plasma pre-treatment, and before the step of selectively depositing the material on at least one of the proximal surface and the distal surface with respect to the sidewall;
- wherein the step of subjecting the substrate to the plasma pre-treatment comprises exposing the substrate to at least one of fluorine-containing molecules, ions, and radicals.

20. A method for topography-selective deposition of a material on a substrate, the substrate comprising a proximal surface and a gap feature, the gap feature comprising a sidewall and a distal surface, the method comprising, in the given order:
- a step of positioning the substrate on a substrate support in a reaction chamber;
- a step of subjecting the substrate to a plasma pre-treatment; and
- a step of selectively depositing a material on at least one of the proximal surface and the distal surface with respect to the sidewall;
- wherein the step of subjecting the substrate to the plasma pre-treatment comprises exposing the substrate to at least one of fluorine-containing molecules, ions, and radicals; and
- wherein the material precursor comprises a silicon precursor.

* * * * *